(12) United States Patent
Cho et al.

(10) Patent No.: US 10,804,480 B2
(45) Date of Patent: Oct. 13, 2020

(54) GRAPHENE LAMINATE AND PREPARATION METHOD THEREFOR

(71) Applicant: CENTER FOR ADVANCED SOFT ELECTRONICS, Pohang (KR)

(72) Inventors: Kilwon Cho, Pohang (KR); Haena Kim, Siheung-si (KR); Boseok Kang, Pohang-si (KR)

(73) Assignees: CENTER FOR ADVANCED SOFT ELECTRONICS, Pohang-Si (KR); POSTECH ACADEMY-INDUSTY FOUNDATION, Pohang-Si (KR)

( * ) Notice: Subject to any disclaimer, the term of this patent is extended or adjusted under 35 U.S.C. 154(b) by 0 days.

(21) Appl. No.: 15/561,039

(22) PCT Filed: Mar. 18, 2016

(86) PCT No.: PCT/KR2016/002761
§ 371 (c)(1),
(2) Date: Sep. 23, 2017

(87) PCT Pub. No.: WO2016/153228
PCT Pub. Date: Sep. 29, 2016

(65) Prior Publication Data
US 2018/0076404 A1  Mar. 15, 2018

(30) Foreign Application Priority Data
Mar. 23, 2015 (KR) .................. 10-2015-0039813

(51) Int. Cl.
*H01L 51/10* (2006.01)
*B32B 9/00* (2006.01)
(Continued)

(52) U.S. Cl.
CPC .............. *H01L 51/105* (2013.01); *B32B 9/00* (2013.01); *B32B 9/007* (2013.01); *B32B 9/04* (2013.01);
(Continued)

(58) Field of Classification Search
CPC .... H01L 51/105; C01B 32/192; C01B 32/198
See application file for complete search history.

(56) References Cited

U.S. PATENT DOCUMENTS

2006/0171874 A1* 8/2006 Khabashesku ......... B82Y 30/00
423/445 B
2012/0141799 A1* 6/2012 Kub ...................... H01L 31/072
428/408
(Continued)

FOREIGN PATENT DOCUMENTS

CN   104078536 A   10/2014
CN   104377252 A   2/2015
(Continued)

OTHER PUBLICATIONS

International Search Report of PCT/KR2016/002761, dated Aug. 1, 2016, English Translation.
(Continued)

*Primary Examiner* — Wael M Fahmy
*Assistant Examiner* — Sarah K Salerno
(74) *Attorney, Agent, or Firm* — STIP Law Group, LLC

(57) ABSTRACT

Disclosed is a graphene laminate including a first graphene layer, containing an electron-donating functional group, and a second graphene layer, disposed on the first graphene layer and configured to include graphene, wherein the second graphene layer is n-doped with the first graphene layer. Thereby, graphene is doped with amino-group-modified graphene, thus preventing the transparency of graphene from decreasing, and the extent of doping of graphene can
(Continued)

be adjusted, and the doping effect can last a long time even without any protective layer.

9 Claims, 14 Drawing Sheets

(51) Int. Cl.
| | |
|---|---|
| *B32B 9/04* | (2006.01) |
| *C01B 32/192* | (2017.01) |
| *H01L 51/44* | (2006.01) |
| *C01B 32/198* | (2017.01) |
| *H01B 1/04* | (2006.01) |
| *H01L 51/00* | (2006.01) |
| *H01L 51/52* | (2006.01) |

(52) U.S. Cl.
CPC .......... *C01B 32/192* (2017.08); *C01B 32/198* (2017.08); *H01B 1/04* (2013.01); *H01L 51/0021* (2013.01); *H01L 51/441* (2013.01); *H01L 51/442* (2013.01); *H01L 51/5203* (2013.01); *Y02E 10/549* (2013.01)

(56) References Cited

U.S. PATENT DOCUMENTS

| | | | |
|---|---|---|---|
| 2012/0202047 A1* | 8/2012 | Welch | B32B 5/16 |
| | | | 428/323 |
| 2013/0306915 A1 | 11/2013 | Lee et al. | |
| 2015/0248972 A1* | 9/2015 | Tang | B32B 9/007 |
| | | | 361/502 |

FOREIGN PATENT DOCUMENTS

| | | |
|---|---|---|
| KR | 1020110115539 A | 10/2011 |
| KR | 101160909 B1 | 6/2012 |
| KR | 101286581 B1 | 2/2013 |
| KR | 20140017787 A | 2/2014 |
| KR | 1020140017787 A | 2/2014 |

OTHER PUBLICATIONS

Office action from China National Intellectual Property Administration of 201680018073.0, dated Aug. 27, 2019.

* cited by examiner

[FIG. 1]
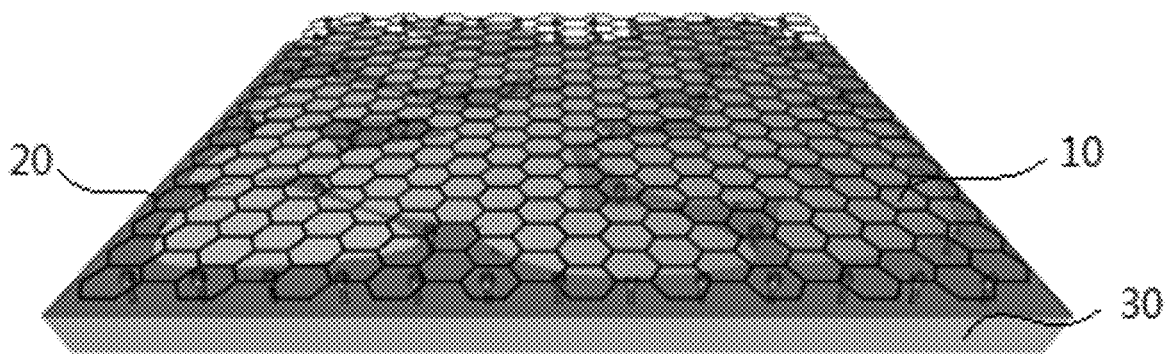

[FIG. 2]
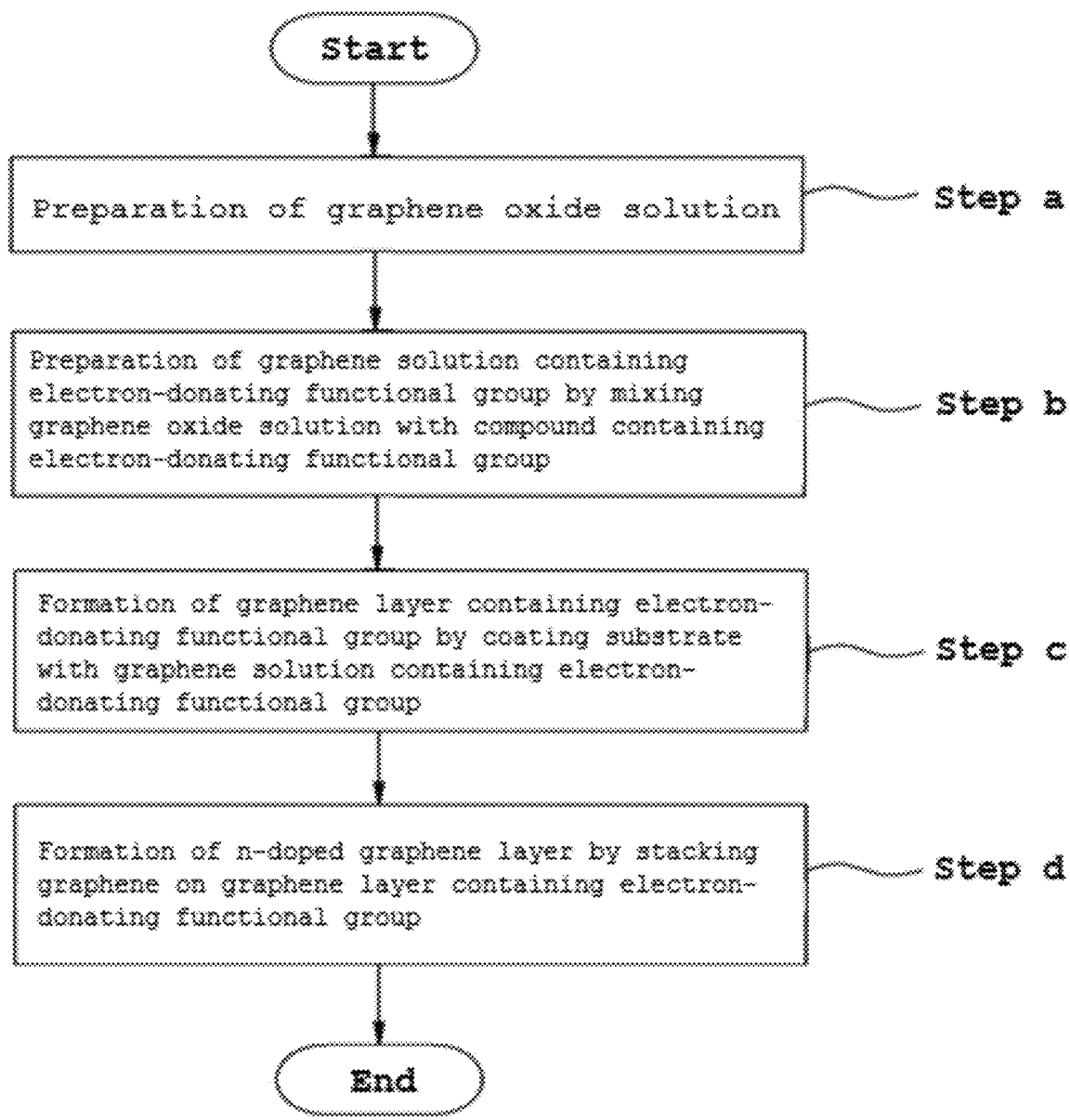

[FIG. 3]
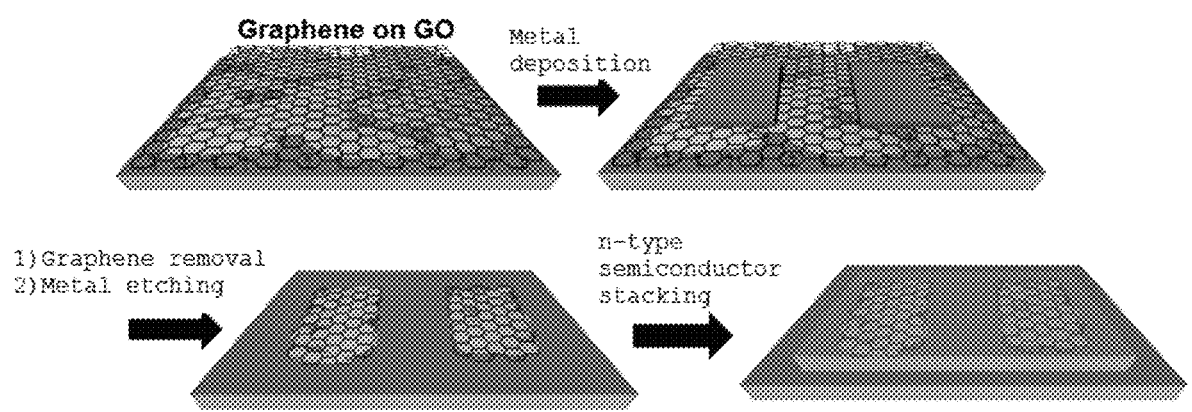

[FIG. 4]
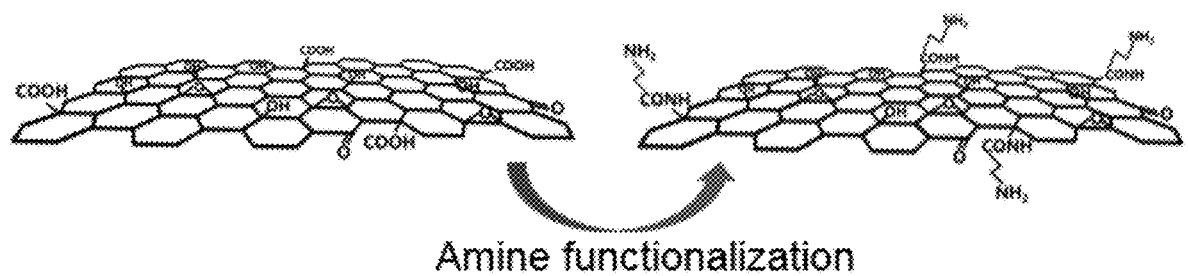
Amine functionalization

[FIG. 5]
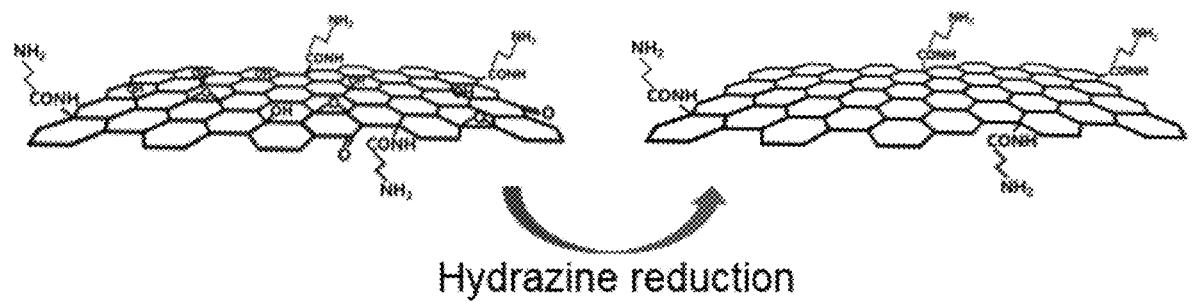

[FIG. 6]
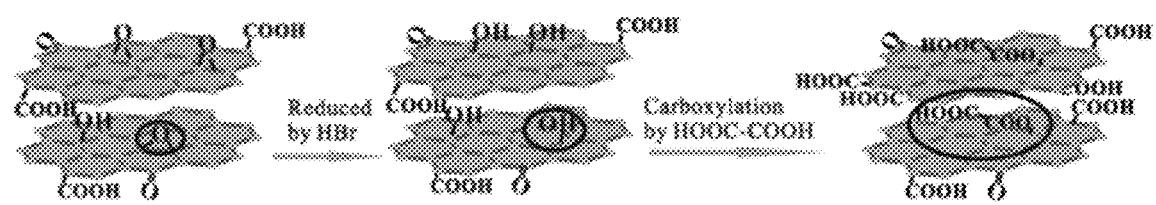
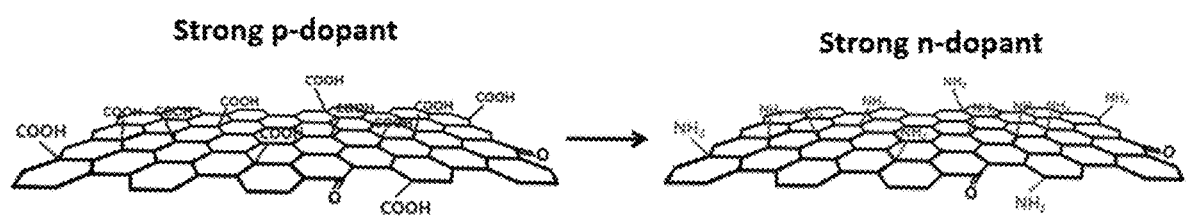

[FIG. 7]
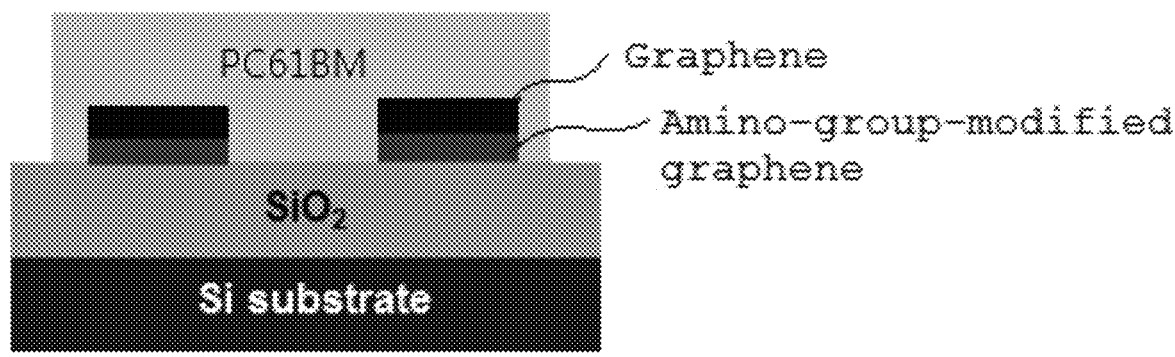

[FIG. 8]
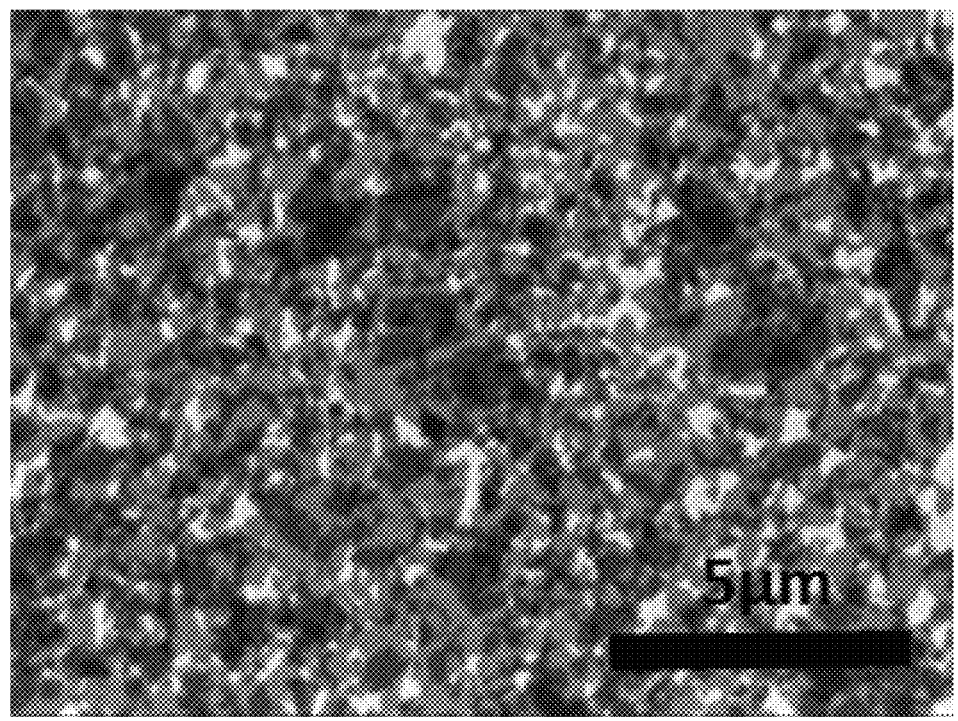

[FIG. 9]
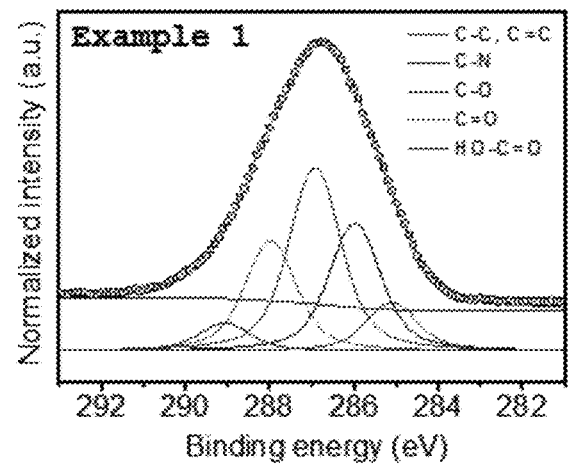
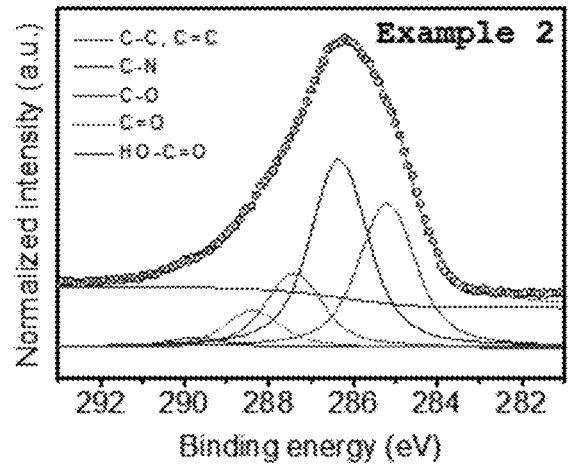
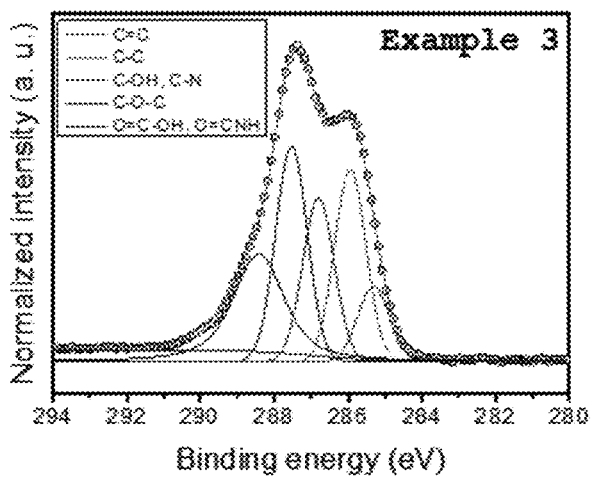

[FIG. 10]
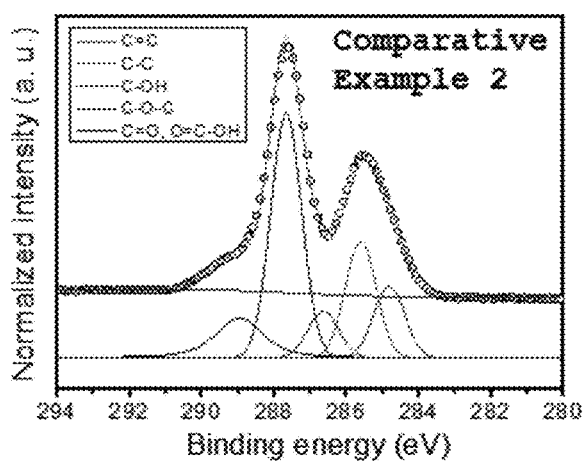
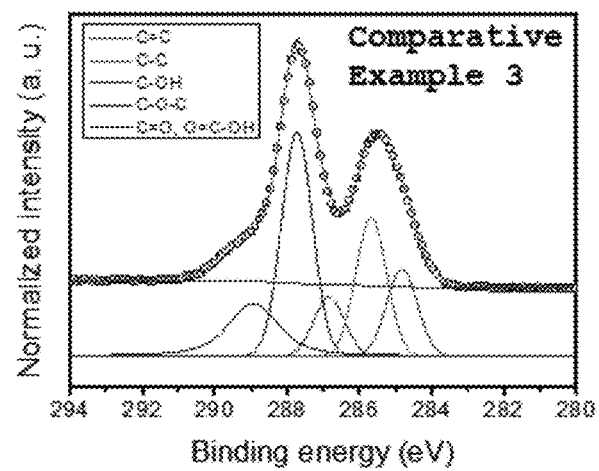

[FIG. 11]
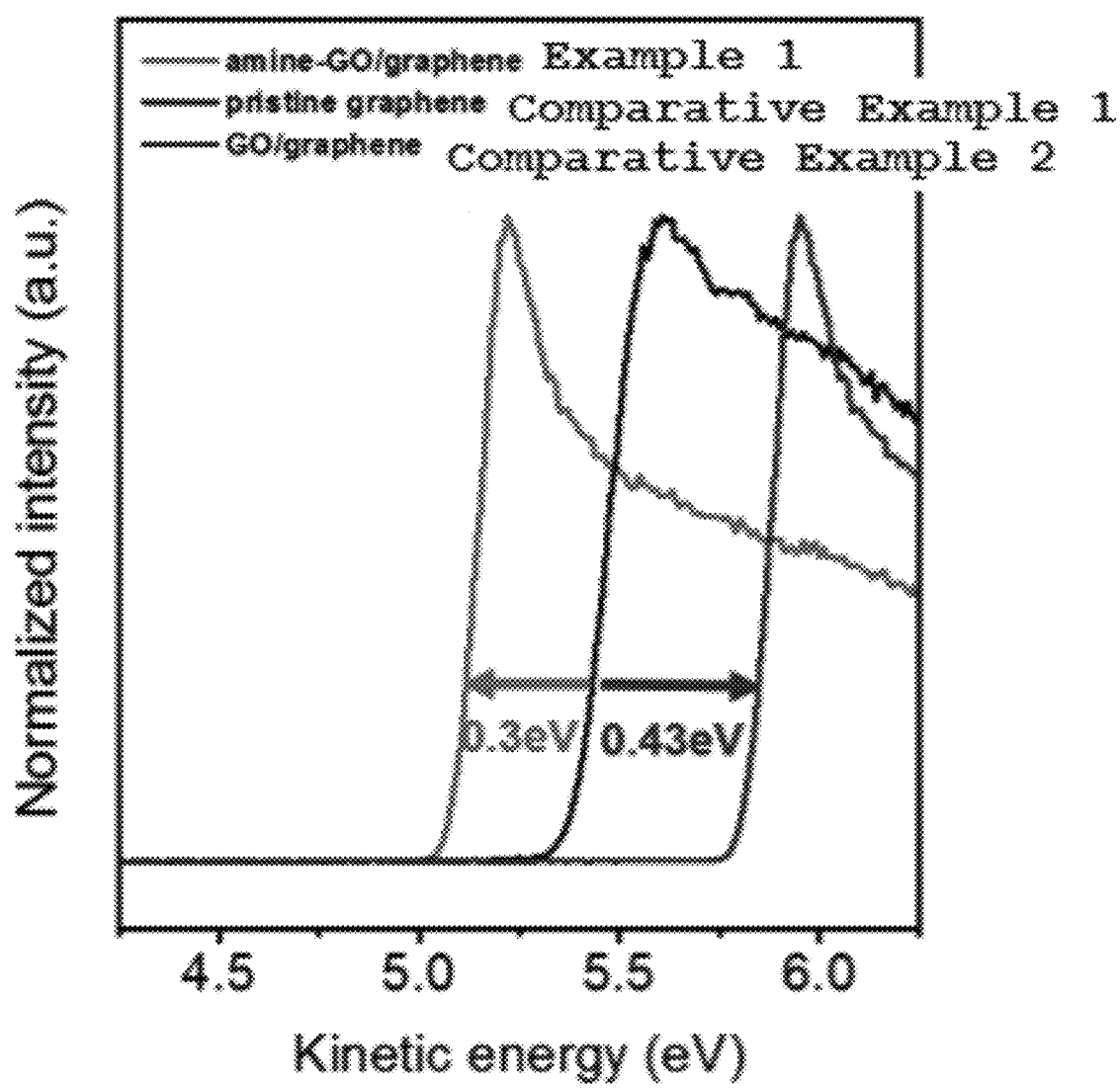

[FIG. 12]
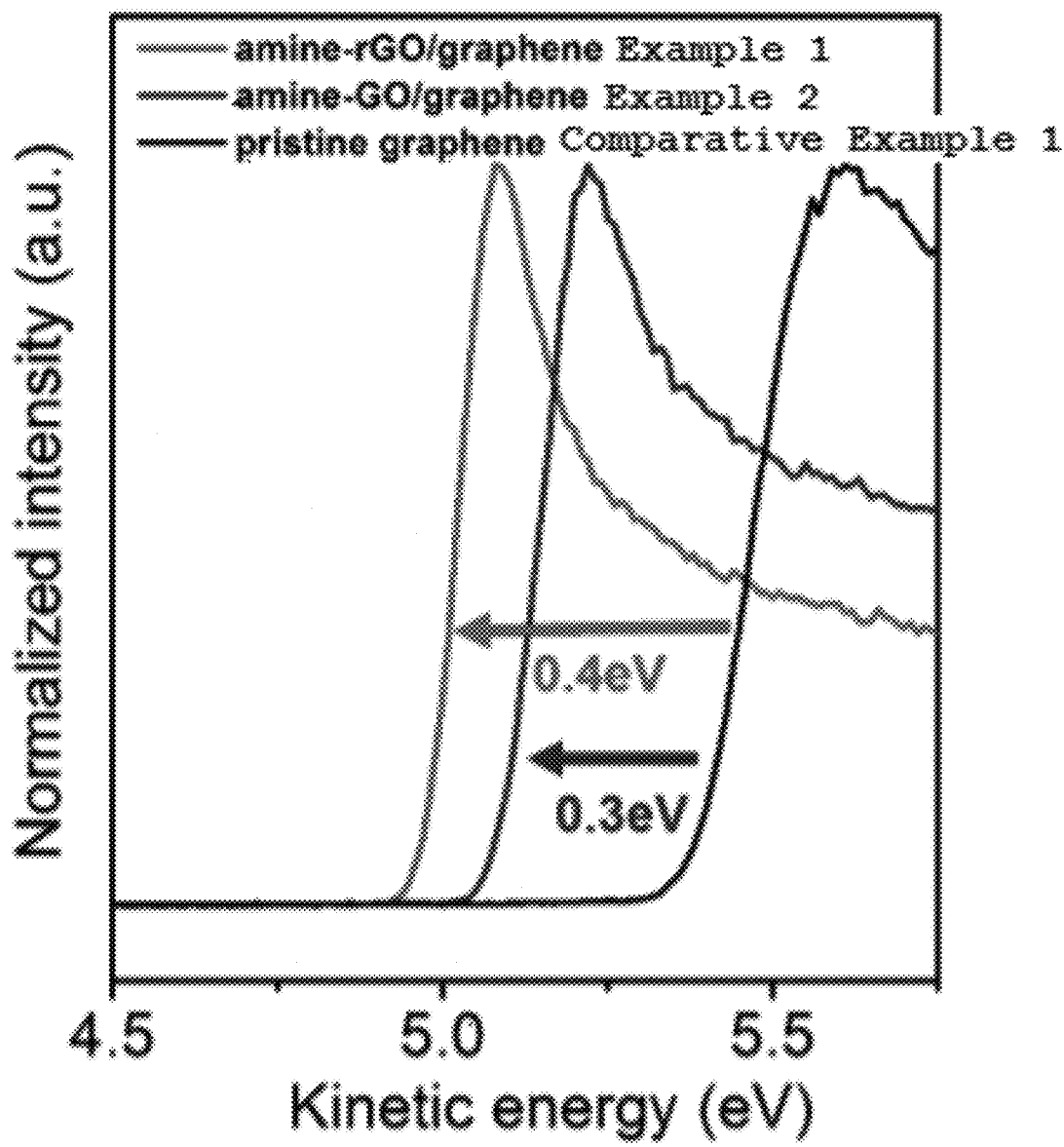

[FIG. 13]
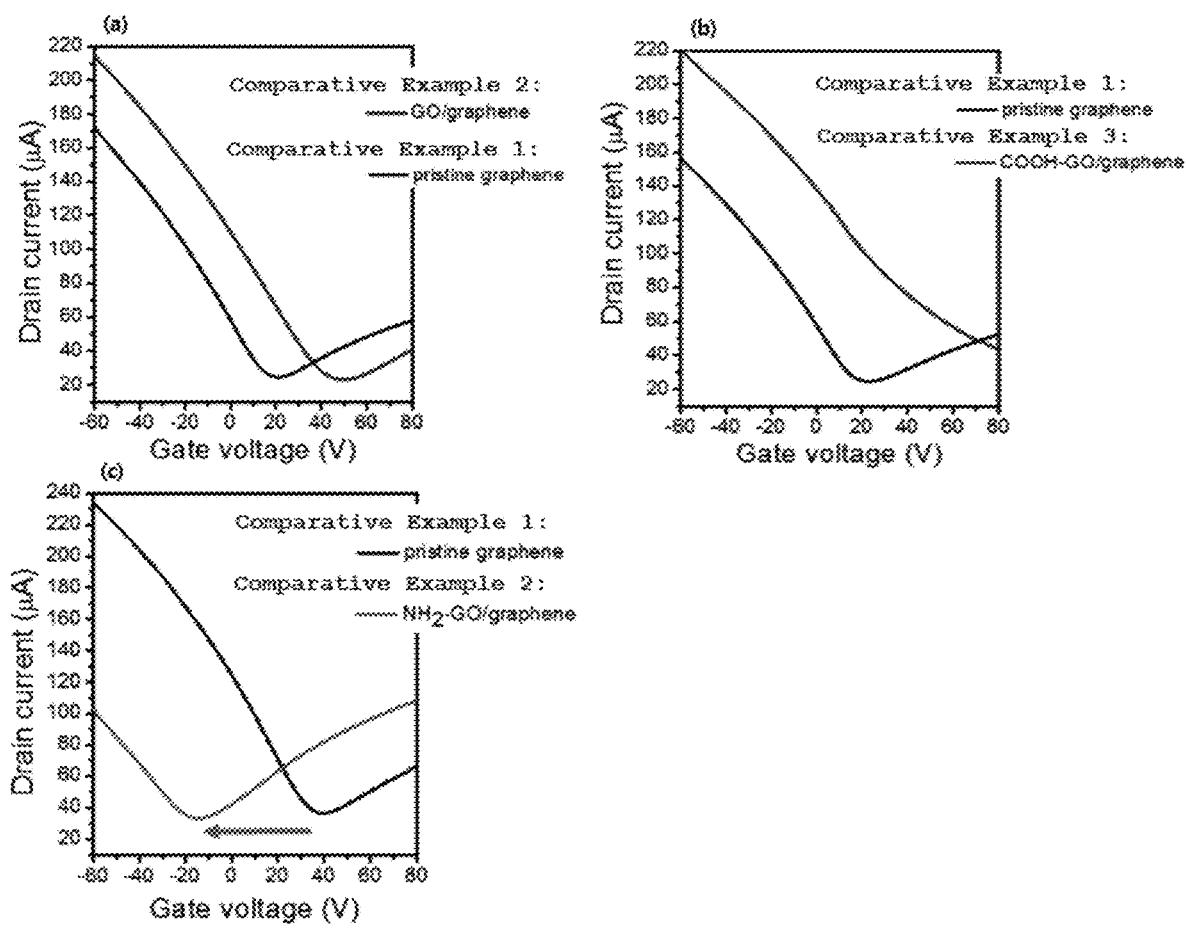

[FIG. 14]
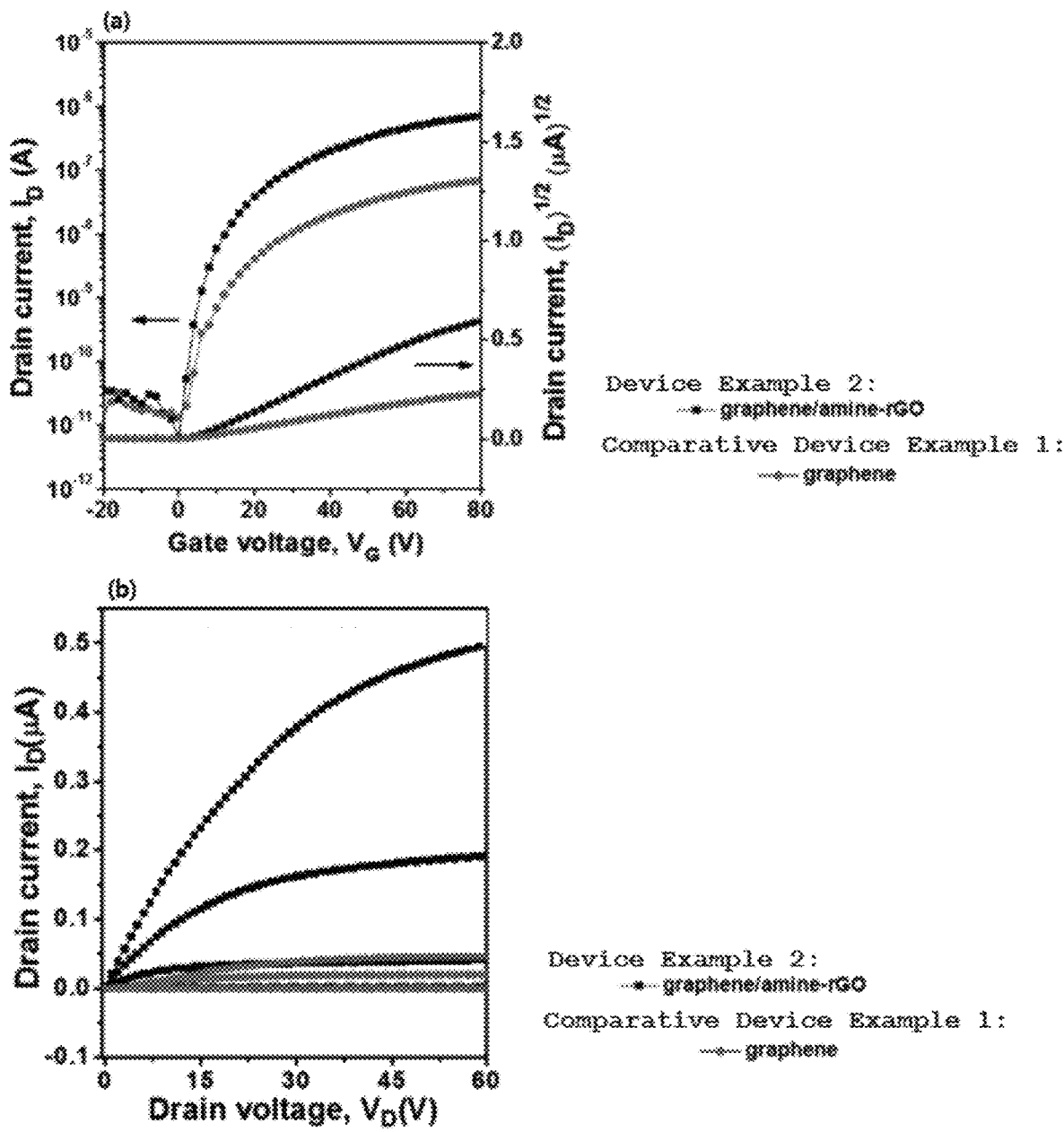

GRAPHENE LAMINATE AND PREPARATION METHOD THEREFOR

CROSS-REFERENCE TO RELATED APPLICATIONS

This application is the U.S. National Phase under 35 U.S.C. § 371 of International Application No. PCT/KR2016/002761 filed on Mar. 18, 2016, which in turn claims the benefit of Korean Application No. 10-2015-0039813, filed on Mar. 23, 2015, the disclosures of which are incorporated by reference into the present application.

TECHNICAL FIELD

The present invention relates to a graphene laminate and a method of manufacturing the same, and more particularly to a graphene laminate imparted with improved conductivity by doping graphene with amino-group-modified graphene, a method of manufacturing the graphene laminate, and an electronic device.

BACKGROUND ART

Graphene is a material composed exclusively of carbon having a two-dimensional honeycomb structure and thus has excellent electrical, mechanical and optical properties. Thorough research thereof is currently ongoing in the field of natural sciences and engineering. Graphene is advantageous because it is composed only of relatively lightweight carbon, making it very easy to process a one-dimensional or two-dimensional nanopattern.

Using graphene, semiconductor-conductor properties may be adjusted, and also, it is possible to manufacture a wide range of functional devices such as sensors, memory, etc. by virtue of the diverse chemical bonds of carbon. Furthermore, the application of such graphene to goods for everyday use, such as transparent electrodes for displays, solar cells, and pressure sensors, is under active study. In such applications, modification of the electrical properties of graphene is essential and is currently under study.

Research into increasing the conductivity of graphene using a p-dopant or an n-dopant has been extensively and intensively carried out to date. For example, Korean Patent Application Publication No. 2012-0064980 discloses a method of manufacturing nitrogen-doped graphene and nitrogen-doped graphene manufactured thereby. Also, conventional studies related to chemical doping have been conducted with the intention of increasing a dirac voltage to a maximum of about 120 V upon device measurement.

However, methods of doping graphene with graphene having a functional group that is stable and controllable during low-temperature processing while imparting strong doping effects have not yet been reported.

DISCLOSURE

Technical Problem

Accordingly, the present invention is intended to provide a graphene laminate, a method of manufacturing the graphene laminate, and an electronic device including the graphene laminate, in which graphene is doped with amino-group-modified graphene, thereby improving electrical properties such as the work function of graphene to thus make it possible to apply such a graphene laminate to transparent flexible electrodes, organic solar cells, organic light-emitting diodes, etc.

Technical Solution

Therefore, an aspect of the present invention provides a graphene laminate, comprising: a first graphene layer containing an electron-donating functional group; and a second graphene layer disposed on the first graphene layer and configured to include graphene, wherein the second graphene layer is n-doped with the first graphene layer.

The electron-donating functional group may be at least one selected from the group consisting of an amino group, a C1 to C10 aminoalkyl group, and a C2 to C10 methoxyalkyl group.

The electron-donating functional group may be an amino group or a C1 to C10 aminoalkyl group.

The amino group or the C1 to C10 aminoalkyl group may be subjected to amide bonding with the first graphene layer.

The first graphene layer may include single-layer or multilayer graphene.

Another aspect of the present invention provides a method of manufacturing a graphene laminate, comprising: preparing a graphene oxide solution (step a); mixing the graphene oxide solution with a compound containing an electron-donating functional group, thus obtaining a graphene solution containing the electron-donating functional group (step b); coating a substrate with the graphene solution containing the electron-donating functional group, thus forming a graphene layer containing the electron-donating functional group (step c); and stacking graphene on the graphene layer containing the electron-donating functional group, thus forming an n-doped graphene layer (step d).

The compound containing the electron-donating functional group may be at least one selected from the group consisting of alkylene diamine, methoxy alkylamine, and dimethylamino alkylamine.

The compound containing the electron-donating functional group may be alkylene diamine, and the alkylene diamine may be C1 to C10 alkylene diamine.

The method of the invention may further include preparing a carboxylated graphene oxide solution by reacting the graphene oxide solution with an acid (step a'), after step a.

Here, step a' may include: reacting the graphene oxide solution with hydrogen halide (step a'-1); and reacting the product of step a'-1 with dicarboxylic acid, thus obtaining the carboxylated graphene oxide solution (step a'-2).

The method of the invention may further include reducing the graphene layer containing the electron-donating functional group (step c'), after step c.

The reducing may be performed in a gas atmosphere including any one selected from the group consisting of hydrazine, hydrazine monohydrate, and dimethylhydrazine.

The reducing may be performed at a temperature of 70 to 300° C.

The solvent included in the graphene oxide solution may be any one selected from the group consisting of water, dimethylformamide, and N-methylpyrrolidone.

In step b, the graphene oxide solution may be further mixed with a carbodiimide derivative or thionyl chloride.

The carbodiimide derivative may be EDC (N-ethyl-N0-(3-dimethylaminopropyl)carbodiimide methiodide).

Still another aspect of the present invention provides an electrode including the graphene laminate.

Yet another aspect of the present invention provides an electronic device including the electrode.

The electronic device may be any one selected from among an organic thin film transistor, an organic solar cell, an organic light-emitting diode, and an organic photodetector.

The source or drain electrode of the organic thin film transistor may include the graphene laminate.

Advantageous Effects

According to the present invention, a graphene laminate is configured such that graphene is doped with amino-group-modified graphene, thus preventing the transparency of graphene from decreasing, and the extent of doping of graphene can be adjusted using graphene, which is variously controllable in a chemical manner, and the doping effect can last for a long time even without any protective layer.

DESCRIPTION OF DRAWINGS

FIG. 1 schematically shows a graphene laminate according to the present invention;

FIG. 2 is a flowchart sequentially showing a process of manufacturing a graphene laminate according to the present invention;

FIG. 3 schematically shows a process of manufacturing an organic thin film transistor including, as an electrode, the graphene laminate of the present invention;

FIG. 4 shows a process of preparing amino-group-modified graphene of Preparation Example 1;

FIG. 5 shows a process of preparing amino-group-modified graphene of Preparation Example 2;

FIG. 6 shows a process of preparing amino-group-modified graphene of Preparation Example 3;

FIG. 7 is a side cross-sectional view showing an organic transistor manufactured in Device Example 1;

FIG. 8 shows FESEM images of the graphene laminates obtained in Examples 1 to 3;

FIG. 9 shows the results of analysis of XPS (X-ray Photoelectron Spectroscopy) of amino-group-modified graphene in the laminates obtained in Examples 1 to 3;

FIG. 10 shows the results of analysis of XPS of graphene or graphene oxide obtained in Comparative Examples 2 and 3;

FIG. 11 shows the results of analysis of UPS (Ultraviolet Photoemission Spectra) of the graphene laminate or graphene obtained in Example 1 and Comparative Examples 1 and 2;

FIG. 12 shows the results of analysis of UPS of the graphene laminate or graphene of Examples 1 and 2 and Comparative Example 1;

FIG. 13 shows the results of analysis of electrical properties of the graphene laminate of Example 3 and Comparative Examples 1 to 3; and FIG. 14 shows power output properties and transfer properties of organic thin film transistors manufactured in Device Example 2 and Comparative Device Example 1.

BEST MODE

Hereinafter, embodiments of the present invention are described in detail with reference to the appended drawings so as to be easily performed by a person having ordinary skill in the art.

However, the following description does not limit the present invention to specific embodiments, and moreover, descriptions of known techniques, even if they are pertinent to the present invention, are considered unnecessary and may be omitted insofar as they would make the characteristics of the invention unclear.

The terms herein are used to explain specific embodiments and are not intended to limit the present invention. Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

Hereinafter, a detailed description will be given of embodiments of the present invention, which are set forth to illustrate but are not to be construed as limiting the present invention, and the present invention is to be defined only by the scope of the accompanying claims.

FIG. 1 schematically shows a graphene laminate according to the present invention.

Below is a description of the graphene laminate of the present invention, made with reference to FIG. 1.

The graphene laminate of the present invention includes a first graphene layer 10 containing an electron-donating functional group, and a second graphene layer 20 positioned on the first graphene layer 10 and configured to include graphene, wherein the second graphene layer 20 may be n-doped with the first graphene layer 10.

The graphene laminate may further include a substrate 30 under the first graphene layer 10.

The electron-donating functional group may be an amino group, a C1 to C10 aminoalkyl group, or a C2 to C10 methoxyalkyl group, and is preferably an amino group or a C1 to C10 aminoalkyl group.

The aminoalkyl group is more preferably a C1 to C5 aminoalkyl group, and much more preferably a C1 to C3 aminoalkyl group.

The first graphene layer 10 is derived from graphene oxide, and is configured such that the electron-donating functional group is bonded to the graphene oxide at the position of an oxygen-containing functional group, such as a carboxyl group, an epoxy group, or a hydroxyl group.

The amino group or aminoalkyl group may be subjected to amide bonding with the graphene oxide thin film.

The first graphene layer 10 may include single-layer or multilayer graphene layer, and preferably includes single-layer graphene.

The first graphene layer 10 may be further bonded with at least one oxygen-containing functional group selected from among a hydroxyl group, an epoxy group, a carbonyl group, and a carboxyl group.

The electron-donating functional group, such as an amino group, having a property of repelling electrons, enables the second graphene layer 20 to be n-doped. On the other hand, the functional group, such as a hydroxyl group, an epoxy group, a carbonyl group, or a carboxyl group, which may be further bonded to the first graphene layer 10, is an electron-accepting functional group having a property of attracting electrons, and thus enables the second graphene layer 20 to be p-doped. Accordingly, the extent of doping may be precisely adjusted depending on changes in the amount of the functional group.

FIG. 2 is a flowchart sequentially showing the process of manufacturing the graphene laminate of the present invention. With reference to FIG. 2, the method of manufacturing the graphene laminate of the present invention is described below.

First, a graphene oxide solution is prepared (step a).

The graphene oxide solution may include graphene oxide in an amount of 0.01 to 10 mg, preferably 0.1 to 7 mg, and more preferably 0.2 to 5 mg for 1 ml of a solvent.

Examples of the solvent may include water, dimethylformamide, and N-methylpyrrolidone, but the scope of the present invention is not limited thereto.

After step a, reacting the graphene oxide solution with an acid to thus prepare a carboxylated graphene oxide solution may be optionally further performed (step a').

Specifically, the graphene oxide solution is reacted with hydrogen halide (step a'-1).

The hydrogen halide may be HCl, HBr, or HI.

Depending on the above reaction, the epoxy group bonded to the graphene oxide may be reduced to a hydroxyl group.

Thereafter, the product of step a'-1 is reacted with dicarboxylic acid, thus obtaining the carboxylated graphene oxide solution (step a'-2).

Examples of the dicarboxylic acid may include oxalic acid, malonic acid, succinic acid, glutaric acid, adipic acid, pimelic acid, suberic acid, and chloroacetic acid.

The graphene oxide solution is mixed with a compound containing an electron-donating functional group, thus preparing a graphene solution containing the electron-donating functional group (step b).

The compound containing the electron-donating functional group may be alkylene diamine, methoxy alkylamine, or dimethylamino alkylamine, and is preferably alkylene diamine.

The alkylene diamine is a C1 to C10 alkylene diamine, preferably a C1 to C5 alkylene diamine, and more preferably a C2 to C4 alkylene diamine.

Preferably, the graphene oxide solution is further mixed with a carbodiimide derivative or thionyl chloride, and mixing with the carbodiimide derivative is more preferable.

The reaction conditions including the solvent and the like may vary depending on which of the carbodiimide derivative or the thionyl chloride is used.

The carbodiimide derivative functions to promote the dehydration condensation reaction between the carboxyl group of graphene oxide and the amino group of alkylene diamine to thus cause amide bonding. The carbodiimide derivative is preferably EDC (N-ethyl-N0-(3-dimethylaminopropyl)carbodiimide methiodide).

Next, the substrate is coated with the graphene solution containing the electron-donating functional group, thus forming a graphene layer containing the electron-donating functional group (step c).

Here, the coating may be performed using any type of coating process, examples of which may include spin coating, dip coating, drop casting, doctor-blade coating, and spray coating. However, the scope of the present invention is not limited thereto, and any coating process may be carried out so long as it may be applied to the present invention.

Next, reducing the graphene layer containing the electron-donating functional group may be optionally further performed (step c').

The reducing may be conducted in a gas atmosphere including hydrazine, hydrazine monohydrate, or dimethylhydrazine.

The reducing may be conducted through thermal treatment. Here, the thermal treatment temperature falls in the range of 70 to 300° C., preferably 80 to 200° C., and more preferably 90 to 150° C.

Given the above thermal treatment temperature range, the thermal treatment time falls in the range of 1 to 30 hr, preferably 5 to 20 hr, and more preferably 8 to 12 hr. However, the scope of the present invention is not limited thereto, and the thermal treatment time may be varied depending on the thermal treatment temperature.

When the reduction treatment is performed in this way, the oxygen-containing functional group, such as a hydroxyl group, an epoxy group, a carbonyl group or a carboxyl group, may be removed from the graphene layer containing the electron-donating functional group, whereby the level of n-doping of the graphene layer to be stacked subsequently may be further increased.

Finally, graphene is stacked on the graphene layer containing the electron-donating functional group, thus forming an n-doped graphene layer (step d).

Stacking the graphene on the graphene layer containing the electron-donating functional group may be performed in a manner in which a support layer for supporting the graphene layer is used to transfer the graphene layer onto the graphene layer containing the electron-donating functional group. However, the scope of the present invention is not limited thereto, and stacking the graphene layer may be conducted using various processes.

The transfer may be performed using any one selected from among wet transfer and dry transfer.

During the transfer of the graphene layer, the support layer for supporting the graphene layer may be used.

The support layer may include any one selected from among polymethyl methacrylate, polybutadiene, and an amorphous fluoropolymer, and is preferably polymethyl methacrylate. The weight average molecular weight of the polymer used for the support layer falls in the range of 5,000 to 1,000,000, preferably 10,000 to 500,000, and more preferably 30,000 to 300,000.

When polymethyl methacrylate is used, a residue effect may be minimized.

The amorphous fluoropolymer is preferably CYTOP (available from BELLEX), and examples of the CYTOP may include type A, the terminal group of which is a carboxyl group (—COOH), type M, the terminal group of which is an amino-silane coupling agent (—CONH~SiOR), and type S, the terminal group of which is a perfluoro group (—CF$_3$).

The present invention addresses an electrode including the graphene laminate.

An electronic device of the present invention may include, as an electrode, the graphene laminate, and examples thereof may include an organic thin film transistor, an organic solar cell, an organic light-emitting diode, an organic photodetector, and the like. In particular, the organic thin film transistor including the graphene laminate as the electrode is described below.

FIG. 3 schematically shows the process of manufacturing an organic thin film transistor including the graphene laminate of the present invention as the electrode. With reference to FIG. 3, the manufacturing process and structure of the organic thin film transistor including the graphene laminate of the present invention as source and drain electrodes are described below.

Specifically, a metal is deposited on the n-doped graphene layer of the graphene laminate to form a pattern for source and drain electrodes. The metal may include aluminum, gold, copper, and nickel, but the scope of the present invention is not limited thereto. Any metal may be used, so long as it is dissolved in an etchant and does not damage graphene.

Next, the n-doped graphene layer is removed from the portion of the graphene laminate on which no metal pattern is formed, and the graphene laminate is then dipped in an etchant to thus etch the metal pattern, thus forming the source and drain electrodes.

Next, the silicon substrate having the source and drain electrodes formed thereon is coated with a semiconductor material, thus forming a gate electrode, thereby manufacturing an organic thin film transistor.

The aforementioned organic thin film transistor may be of a bottom-contact type, but the scope of the present invention is not limited thereto, and a top-contact type may be manufactured in some cases.

The semiconductor layer may be formed of an n-type semiconductor, examples of which may include a fullerene derivative, PTCDI-C13 (N,N'-ditridecylperylene-3,4,9,10-tetracarboxylic diimide), and N2200 (poly(N,N'-bis-2-octyl-dodecylnaphtalene-1,4,5,8-bis-dicarboximide-2,6-diyl-alt-5,5-2,2-bithiophene)), but the scope of the present invention is not limited thereto.

The fullerene derivative may be represented by Structural Formula 1 below.

[Structural Formula 1]

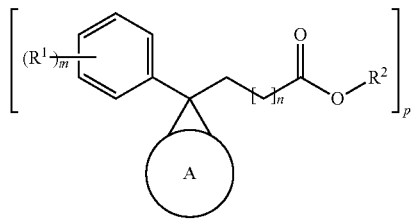

In Structural Formula 1,

A is C60, C70, C72, C76, C78, C80, C82, C84, or C90 fullerene, $R^1$ is independently a hydrogen atom or a C1 to C10 alkoxy group, $R^2$ is independently a hydrogen atom or a C1 to C10 alkyl group, m is independently any one integer of 1 to 5, n is independently any one integer of 0 to 6, and p is independently any one integer of 1 to 5.

More preferably, the fullerene derivative represented by Structural Formula 1 is any one selected from among PC61BM ([6,6]-phenyl-C61-butyric acid methyl ester), PC71BM (phenyl-C71-butyric acid methyl ester), bisPCBM (bisadduct of phenyl C61-butyric acid methyl ester), and trisPCBM (trisadduct of phenyl C61-butyric acid methyl ester).

MODE FOR INVENTION

Examples

Preparation Example 1

Preparation of Amino-Group-Modified Graphene Oxide

A graphene oxide powder was prepared from natural graphite (Alfa Aesar, 99.999% purity, −200 mesh) through a modified Hummers method (W. S. Hummers and R. E. Offeman, J. Am. Chem. Soc., 1958, 80, 1339).

Specifically, 20 g of a graphite powder and 460 ml of sulfuric acid were placed in a flask and 60 g of manganese peroxide was added slowly thereto for about 1 hr. Thereafter, the solution was stirred in an ice water bath for 2 hr and vigorously stirred at room temperature for 3 days. Thereafter, the above solution in the ice water bath was added with 920 ml of distilled water and 50 ml of hydrogen peroxide (30 wt %) and stirred at room temperature for 2 hr. Thereafter, the solution was lyophilized at −70° C. using a lyophilizer for 3 days, thus preparing a graphene oxide powder having a C/O (carbon atom/oxygen atom) ratio of 1.14. The graphene oxide powder thus prepared was bonded with an aminoethyl group through the following method.

25 mg of the graphene oxide powder was added to 50 ml of water and dispersed using a sonicator to give a graphene oxide solution, which was then added with 4 ml of EDA (ethylenediamine) and 600 mg of EDC (1-ethyl-3-(3-dimethylaminopropyl)carbodiimide methiodide) and stirred at room temperature for 4 hr. To remove the remaining reactants or byproducts after the reaction, the solution was placed in a dialysis tube and dialyzed for 24 hr, thereby yielding amino-group-modified graphene oxide.

The process of preparing amino-group-modified graphene oxide of Preparation Example 1 is illustrated in FIG. 4.

Preparation Example 2

Preparation of Amino-Group-Modified Graphene

The aminoethyl group-bonded graphene oxide obtained in Preparation Example 1 was further reduced using a hydrazine gas at 100° C. for 10 hr, thus removing the oxygen-containing functional groups and yielding amino-group-modified graphene.

The process of preparing amino-group-modified graphene of Preparation Example 2 is illustrated in FIG. 5.

Preparation Example 3

Preparation of Aminoethyl Group-Bonded Graphene Oxide After Modification with Carboxyl Group A graphene oxide powder obtained in the same manner as in Preparation Example 1 was dispersed at a concentration of 2.5 g/L in water to give a solution, 30 ml of which was added with 5 ml of HBr, vigorously stirred at room temperature for 12 hr, added with oxalic acid, and stirred for 4 hr, thus preparing carboxyl-group-modified graphene oxide, which was then filtered.

Aminoethyl-group-bonded graphene oxide was prepared in the same manner as in Preparation Example 1, with the exception that carboxyl-group-modified graphene oxide was used in lieu of graphene oxide.

The process of preparing graphene oxide of Preparation Example 3 is illustrated in FIG. 6.

Example 1

Formation of Graphene Laminate

The graphene oxide obtained in Preparation Example 1 was dispersed in water to give a 0.8 g/L amino-group-modified graphene oxide solution. The amino-group-modified graphene oxide solution was dropped onto a SiO$_2$/Si substrate and then allowed to stand for 40 sec. Thereafter, spin coating at 1000 rpm for 100 sec and then spin coating at 4000 rpm for 30 sec were performed, thus obtaining a silicon substrate (SiO$_2$/Si) having the amino-group-modified graphene layer formed thereon.

The graphene grown on a copper foil was coated with PMMA (polymethyl methacrylate, 150 k), and the graphene present on the surface thereof opposite the coating surface was removed through oxygen plasma treatment, and the copper foil was dipped in a 0.1 M ammonium persulfate aqueous solution. After completion of the etching of the copper foil, the PMMA/graphene film floating on the aqueous solution was moved to a distilled water bath and then transferred onto the silicon substrate (SiO$_2$/Si) having the amino-group-modified graphene layer formed thereon.

The silicon substrate was dipped in a dilute hydrogen fluoride solution (5 wt %) so that silicon oxide was etched, thus obtaining a laminate comprising PMMA/graphene layer/amino-group-modified graphene oxide layer. The laminate comprising PMMA/graphene layer/amino-group-modified graphene oxide layer was taken out of the dilute solution using a HMDS (hexamethyldisilazane)-treated substrate, and PMMA was removed, thus yielding a graphene laminate.

Example 2

Formation of Graphene Laminate

A graphene laminate was formed in the same manner as in Example 1, with the exception that the amino-group-modified graphene of Preparation Example 2 was used in lieu of that of Preparation Example 1.

Example 3

Formation of Graphene Laminate

A graphene laminate was formed in the same manner as in Example 1, with the exception that the amino-group-modified graphene oxide of Preparation Example 3 was used in lieu of that of Preparation Example 1.

Comparative Example 1

Formation of Graphene Thin Film

The graphene grown on a copper foil was coated with PMMA (150 k), and the graphene present on the surface thereof opposite the coating surface was removed through oxygen plasma treatment, and the copper foil was dipped in a 0.1 M ammonium persulfate aqueous solution. After completion of the etching of the copper foil, the PMMA/graphene film floating on the aqueous solution was moved to a distilled water bath and then transferred onto a silicon substrate. The substrate was dipped in a dilute hydrogen fluoride solution (5 wt %) so that silicon oxide was etched, whereby a PMMA/graphene film was floated on the dilute solution. The film was taken out of the dilute solution using a HMDS-treated substrate, and PMMA was removed, thus yielding a graphene thin film.

Comparative Example 2

Formation of Graphene Laminate Including Graphene Oxide Layer

A graphene laminate including a graphene oxide layer was formed in the same manner as in Example 1, with the exception that a graphene oxide solution, obtained by dispersing 0.1 g of a graphene oxide powder prepared in the same manner as in Preparation Example 1 in 1 L of a water solvent, was used in lieu of the amino-group-modified graphene oxide solution.

Comparative Example 3

Formation of Graphene Laminate Including Carboxyl-Group-Modified Graphene Oxide Layer A graphene laminate including a carboxyl-group-modified graphene oxide layer was formed in the same manner as in Example 1, with the exception that carboxyl-group-modified graphene oxide obtained in the same manner as in Preparation Example 3 was used in lieu of the graphene oxide of Preparation Example 1.

Device Example 1

Manufacture of Organic Thin Film Transistor

An organic thin film transistor was manufactured using the graphene laminate of Example 1 as source and drain electrodes.

Specifically, aluminum was stacked using a mask pattern on the graphene laminate of Example 1, and graphene was removed from the portion of the graphene laminate having no aluminum thereon using oxygen plasma, thus forming a graphene pattern. Thereafter, aluminum was dipped in an etchant, etched, and spin-coated with PC61BM at 2000 rpm for 60 sec, thus obtaining an organic thin film transistor. The side cross-sectional view of the organic transistor thus manufactured is shown in FIG. 7.

Device Example 2

Manufacture of Organic Thin Film Transistor

An organic thin film transistor was manufactured in the same manner as in Device Example 1, with the exception that the graphene laminate of Example 2 was used in lieu of Example 1.

Device Example 3

Manufacture of Organic Thin Film Transistor

An organic thin film transistor was manufactured in the same manner as in Device Example 1, with the exception that the graphene laminate of Example 3 was used in lieu of Example 1.

Comparative Device Example 1

Manufacture of Organic Thin Film Transistor

An organic thin film transistor was manufactured in the same manner as in Device Example 1, with the exception that the graphene thin film of Comparative Example 1 was used in lieu of Example 1.

Comparative Device Example 2

Manufacture of Organic Thin Film Transistor

An organic thin film transistor was manufactured in the same manner as in Device Example 1, with the exception that the graphene laminate including the graphene oxide layer of Comparative Example 2 was used in lieu of Example 1.

Comparative Device Example 3: Manufacture of Organic Thin Film Transistor

An organic thin film transistor was manufactured in the same manner as in Device Example 1, with the exception that the laminate including the carboxyl-group-modified graphene oxide layer of Comparative Example 3 was used in lieu of Example 1.

Test Examples

Test Example 1

FESEM Image of Graphene Laminate

The FESEM image of the graphene laminate of Example 1 is shown in FIG. 8. The graphene was seen to be transferred onto the substrate having the graphene layer containing the electron-donating functional group formed thereon.

Test Example 2

Analysis of XPS (X-Ray Photoelectron Spectroscopy)

The results of analysis of XPS of the amino-group-modified graphene layer in the laminates of Examples 1 to 3 are shown in FIG. 9, and the results of analysis of XPS of the graphene or graphene oxide of Comparative Examples 2 and 3 are shown in FIG. 10.

As shown in FIGS. 9 and 10, the graphene laminate of Example 1 showed a C—N peak that does not appear in Comparative Examples 1 to 3, from which the amino group can be found to have been introduced. Also, in Example 2, in which reduction treatment was further performed, the C—O peak was decreased compared to Example 1. The C—N peak appeared more strongly in Example 3 than in Example 2.

Test Example 3

Analysis of Doping Effect Based on UPS

FIG. 11 shows the results of analysis of UPS (Ultraviolet Photoemission Spectra) of the graphene laminate or graphene of Example 1 and Comparative Examples 1 and 2, and FIG. 12 shows the results of analysis of UPS of the graphene laminate or graphene of Examples 1 and 2 and Comparative Example 1.

Here, the work function was measured through UPS and calculated according to Equation 1 below.

$$\Phi = h\omega - |E_{sec} - E_{FE}|$$ [Equation 1]

In Equation 1, $E_{sec}$ is the onset of secondary emission, and $E_{FE}$ is the Fermi edge (−128.1 eV) at a voltage of −20 V applied to the graphene laminate.

As shown in FIGS. 11 and 12, the graphene oxide of Comparative Example 1 was allowed to p-dope the graphene by 0.43 eV, whereas the amino-group-modified graphene oxide layer of Example 1 was allowed to n-dope the graphene by 0.3 eV.

The amino-group-modified graphene layer additionally subjected to reduction treatment in Example 2 was allowed to further n-dope the graphene by 0.1 eV compared to the amino-group-modified graphene oxide layer of Example 1. Accordingly, the n-doping effect of the amino group can be deemed to be further improved by removing the carbonyl group, the hydroxyl group, and the epoxy group, which are able to attract the remaining electrons.

Test Example 4

Analysis of Doping Effect Depending on Electrical Properties

FIG. 13 shows the results of analysis of electrical properties of the graphene laminate or the gold-deposited graphene laminate of Example 3 and Comparative Examples 1 to 3. Specifically, (a) shows the results of Comparative Examples 1 and 2, (b) shows the results of Comparative Examples 1 and 3, and (c) shows the results of Comparative Example 1 and Example 3.

As shown in FIG. 13, upon doping with the graphene oxide of Comparative Example 2, the dirac voltage of graphene was changed by about 30 V, and the graphene doped with the carboxyl-group-modified graphene oxide of Comparative Example 3 was changed by 60 V or more. Thus, the carboxyl-group-modified graphene oxide can be found to exhibit very high p-doping effects compared to typical graphene oxide.

Also upon doping with the carboxyl-group-modified graphene oxide of Comparative Example 3, the dirac voltage of graphene was changed by +60 V or more, and the graphene doped with the amino-group-modified graphene of Example 3 was changed by −55 V. Therefore, the dirac voltage of graphene can be anticipated to be changed by −115 V by substituting the carboxyl group with the amino group.

Test Example 5

Analysis of Properties of Organic Thin Film Transistor Including Graphene Laminate as Source/Drain Electrodes The power output properties and the transfer properties of the organic thin film transistors of Device Example 2 and Comparative Device Example 1 are shown in FIG. 14.

As shown in FIG. 14, the mobility of the transistor of Comparative Device Example 1 was $1.72 \times 10^{-4}$ $cm^2V^{-1}s^{-1}$, whereas the mobility of the transistor of Device Example 2 was as high as $1.19 \times 10^{-3}$ $cm^2V^{-1}s^{-1}$, and the on/off ratio was also high. Furthermore, the S-shaped non-ohmic behavior at the low drain voltage in the transfer curve was considerably decreased by the addition of graphene oxide. Such changes are deemed to be because the work function of the electrode comprising the n-doped graphene layer/amino-group-modified graphene layer matches the LUMO level of PCBM, due not only to the low sheet resistance of the electrode comprising the n-doped graphene layer/amino-group-modified graphene layer but also to the doping effect of the amino-group-modified graphene layer, and thus the carrier injection barrier is lowered.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

A graphene laminate of the present invention is configured such that graphene is doped with amino-group-modified graphene, thus preventing the transparency of graphene from decreasing, and the extent of doping of graphene can be adjusted using graphene that is variously controllable in a chemical manner, and the doping effect can last a long time even without any protective layer.

The invention claimed is:

1. A graphene laminate, comprising:
   a functionalized graphene layer containing an electron-donating functional group and a graphene layer, wherein the graphene layer is functionalized by the electron-donating functional group to form the functionalized graphene layer; and
   a second graphene layer disposed on the functionalized graphene layer and configured to include graphene,
   wherein the second graphene layer is in direct contact with the functionalized graphene layer such that the second graphene layer is n-doped with the functionalized graphene layer.

2. The graphene laminate of claim 1, wherein the electron-donating functional group is at least one selected from the group consisting of an amino group, a C1 to C10 aminoalkyl group, and a C2 to C10 methoxyalkyl group.

3. The graphene laminate of claim 2, wherein the electron-donating functional group is an amino group or a C1 to C10 aminoalkyl group.

4. The graphene laminate of claim 3, wherein the amino group or the C1 to C10 aminoalkyl group is subjected to amide bonding with the functionalized graphene layer.

5. The graphene laminate of claim 1, wherein the functionalized graphene layer includes single-layer or multilayer graphene.

6. An electrode, including the graphene laminate of claim 1.

7. An electronic device, including the electrode of claim 6.

8. The electronic device of claim 7, wherein the electronic device is any one selected from among an organic thin film transistor, an organic solar cell, an organic light-emitting diode, and an organic photodetector.

9. The electronic device of claim 8, wherein a source or drain electrode of the organic thin film transistor includes the graphene laminate.

* * * * *